United States Patent
Chang et al.

(10) Patent No.: US 9,627,310 B2
(45) Date of Patent: Apr. 18, 2017

(54) SEMICONDUCTOR DEVICE WITH SELF-ALIGNED INTERCONNECTS

(75) Inventors: Shih-Ming Chang, Zhubei (TW); Ken-Hsien Hsieh, Taipei (TW); Tsong-Hua Ou, Taipei (TW); Ru-Gun Liu, Hsinchu (TW); Fang-Yu Fan, Hukou Township, Hsinchu County (TW); Yuan-Te Hou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 414 days.

(21) Appl. No.: 13/444,648

(22) Filed: Apr. 11, 2012

(65) Prior Publication Data
US 2013/0270704 A1 Oct. 17, 2013

(51) Int. Cl.
*H01L 23/528* (2006.01)
*H01L 23/522* (2006.01)
*H01L 21/768* (2006.01)
*H01L 21/311* (2006.01)
*H01L 23/532* (2006.01)

(52) U.S. Cl.
CPC ...... *H01L 23/522* (2013.01); *H01L 21/31144* (2013.01); *H01L 21/76816* (2013.01); *H01L 23/528* (2013.01); *H01L 23/5329* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,160,907 A | * | 11/1992 | Nakajima | H01L 23/49822 174/255 |
| 5,353,235 A | * | 10/1994 | Do | G06F 17/5081 716/130 |
| 5,834,845 A | * | 11/1998 | Stolmeijer | 257/752 |
| 5,891,799 A | | 4/1999 | Tsui | |
| 6,576,848 B1 | * | 6/2003 | Cronin et al. | 174/261 |
| 6,717,267 B1 | * | 4/2004 | Kunikiyo | 257/758 |
| 7,482,675 B2 | * | 1/2009 | Adkisson et al. | 257/620 |

(Continued)

OTHER PUBLICATIONS

US Patent Office, unpublished U.S. Appl. No. 13/461,224, filed May 1, 2012, titled "Via-Free Interconnect Structure with Self-Aligned Metal Line Interconnections," 32 pages.

*Primary Examiner* — Hoang-Quan Ho
(74) *Attorney, Agent, or Firm* — Haynes and Boone, LLP

(57) ABSTRACT

A multilayer device and method for fabricating a multilayer device is disclosed. An exemplary multilayer device includes a substrate, a first interlayer dielectric (ILD) layer disposed over the substrate, and a first conductive layer including a first plurality of conductive lines formed in the first ILD layer. The device further includes a second ILD layer disposed over the first ILD layer, and a second conductive layer including a second plurality of conductive lines formed in the second ILD layer. At least one conductive line of the second plurality of conductive lines is formed adjacent to at least one conductive line of the first plurality of conductive lines. The at least one conductive line of the second plurality of conductive lines contacts the at least one conductive line of the first plurality of conductive lines at an interface.

18 Claims, 18 Drawing Sheets

(56) References Cited

U.S. PATENT DOCUMENTS

| | | | |
|---|---|---|---|
| 8,779,592 B2* | 7/2014 | Tang | H01L 23/5221 |
| | | | 257/211 |
| 2003/0205816 A1* | 11/2003 | Janke | 257/758 |
| 2009/0291388 A1 | 11/2009 | Assefa et al. | |
| 2012/0086128 A1* | 4/2012 | Ponoth | H01L 21/76897 |
| | | | 257/774 |
| 2013/0292836 A1* | 11/2013 | Tang | H01L 23/5221 |
| | | | 257/773 |

* cited by examiner

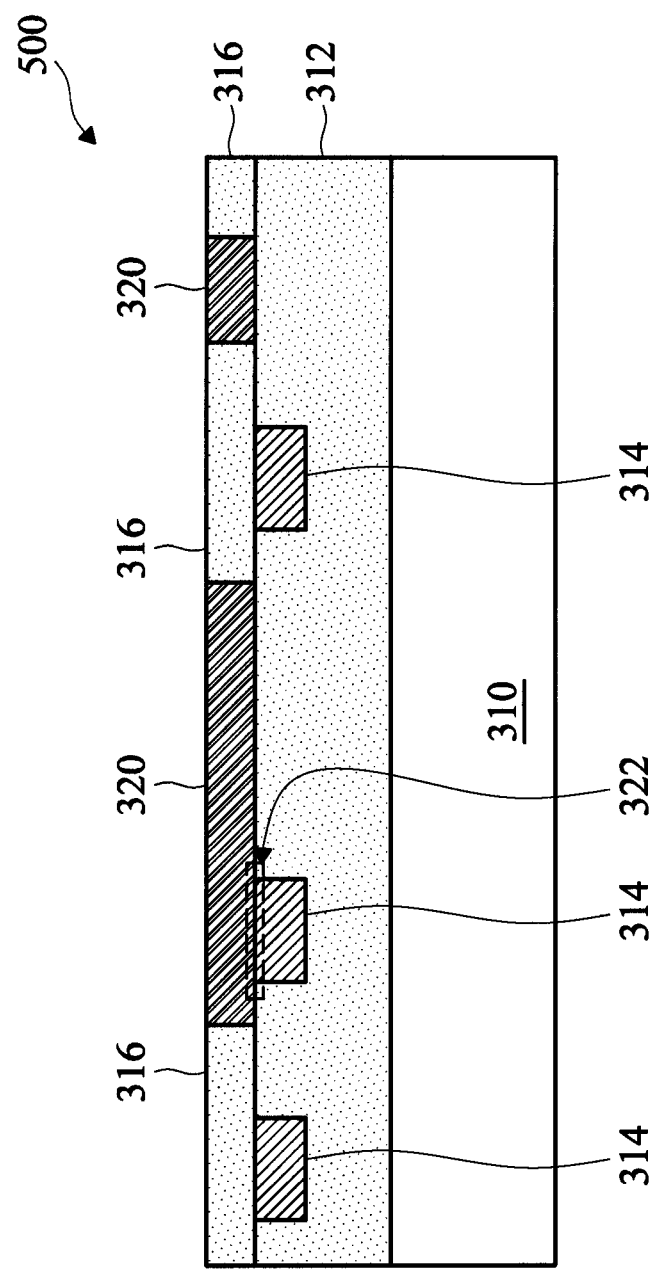

SEMICONDUCTOR DEVICE WITH SELF-ALIGNED INTERCONNECTS

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of multilayer (or three dimensional) integrated devices. The multilayer devices may include a plurality of interlayer dielectric layers (ILDs) each including one or more conductive layers which are aligned and connected with other conductive layers. However, as the scaling down continues, forming and aligning conductive layers has proved difficult. Accordingly, although existing multilayer devices and methods of fabricating multilayer devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11-18 illustrate diagrammatic cross-sectional side views of one embodiment of a multilayer device at various stages of fabrication, according to the method of FIG. 10.

DETAILED DESCRIPTION

Figure 1:
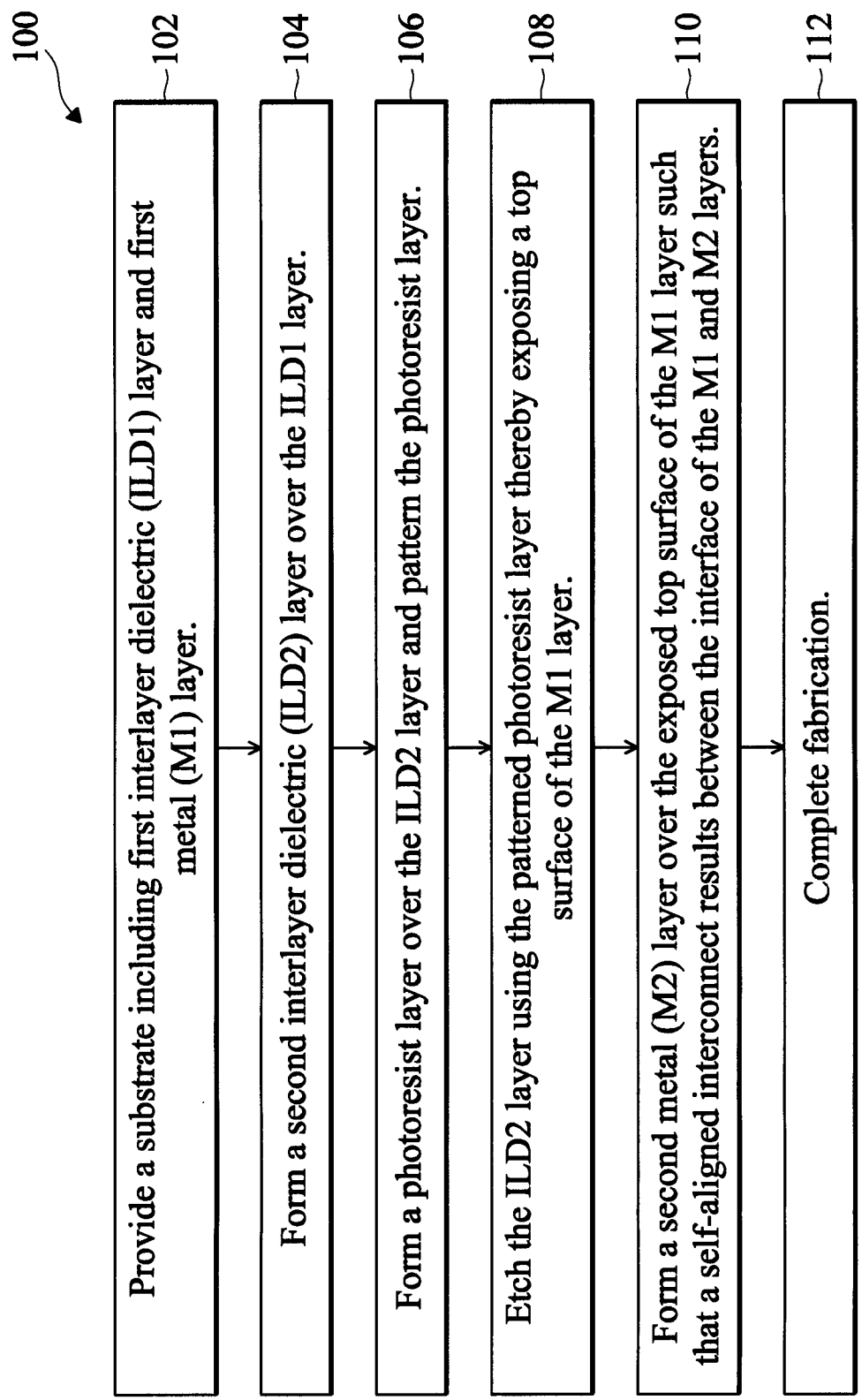
FIG. 1 is a flowchart illustrating a method of fabricating a multilayer device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Modern semiconductor devices may utilize an interconnect structure to perform electrical routing between the various components and features on a semiconductor wafer and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate. In more detail, the interconnect structure may include a plurality of interconnect layers, also referred to as metal layers (e.g., M1, M2, M3, etc). Each of the interconnect layers includes a plurality of interconnect features, also referred to as metal lines. An interlayer dielectric (ILD) which may comprise a plurality of ILD layer of the interconnect structure provides isolation between the metal lines.

An interconnect structure may also include a plurality of vias/contacts that provide electrical connections between the metal lines from different interconnect layers. For example, a via may extend vertically and therefore allows a metal line from the M1 layer to be electrically connected to another metal line from the M2 layer. As semiconductor device fabrication technologies continue to evolve, the sizes of the various features on a semiconductor device become smaller and smaller, including the sizes of the vias and metal lines. This leads to fabrication challenges. For example, the formation of the vias may involve one or more lithography and etching processes. Variations associated with these processes (e.g., critical dimension uniformity variations or lithography overlay errors) exacerbate via alignment problems. Alternatively stated, the device scaling down process may place a more stringent requirement on the precise alignment between the via and the interconnected metal lines above and/or below, since a small shift can cause the via to be misaligned with the metal lines. Therefore, an improved interconnect structure that does not suffer from these via alignment problems is desired.

According to the various aspects of the present disclosure, a via-free interconnect structure is disclosed. The via-free interconnect structure contains metal layers where the metal lines are electrically coupled to other metal lines from different metal layers, thereby obviating the need for vias to perform the interconnections. In other words, the metal lines are self-aligned. The various aspects of such interconnect structure is described in more detail below.

With reference to FIGS. 1 and 2-9, a method 100 and multilayer device 200 and 300 are collectively described below. FIG. 1 is a flow chart of a method 100 for fabricating an integrated circuit device according to various aspects of the present disclosure. In the present embodiment, the method 100 is for fabricating a multilayer integrated circuit device. The method 100 begins at block 102 where a substrate including first interlayer dielectric (ILD1) layer and first metal (M1) layer is provided. At block 104, second interlayer dielectric (ILD2) layer is formed over the ILD1 layer. The method continues with block 106 where a patterned photoresist layer is formed over the ILD2 layer. The method continues with block 108 where the ILD2 layer is etched using the patterned photoresist layer thereby uncovering a top surface of the M1 layer. The etching process may include multiple etching steps/process including dry etching, wet etching, or a combination of both. At block 110, a second metal (M2) layer is formed over the uncovered top surface of the M1 layer such that a self-aligned interconnect results between the interface of the M1 and M2 layers. A CMP process may be performed to remove excess M2 layer material and the photoresist layer, thus planarizing the top surface of the multilayer device. In alternative embodiments, the patterned photoresist is removed prior to formation of the M2 layer, after which a CMP process is performed to remove excess M2 layer material. The method 100 continues with block 112 where fabrication of the integrated circuit device is completed. It is understood that although the present embodiment describes the conductive layers as being metal layers (e.g., M1 and M2) the conductive layers may be any appropriate conductive material. Further, it is understood that although the present embodiment describes only two conductive layers (e.g., M1 and M2) more than two conducive layers are contemplated. Additional steps can be provided before, during, and after the method 100, and some of the steps described can be replaced or eliminated for other embodiments of the method. The discussion that follows illustrates various embodiments of a multilayer device that can be fabricated according to the method 100 of FIG. 1.

FIGS. 2-9 illustrate diagrammatic top and cross-sectional side views of one embodiment of a multilayer device 200 and 300 at various stages of fabrication, according to the method of FIG. 1. It is understood that the multilayer device 200 and 300 may include various other devices and features, such as other types of transistors such as bipolar junction transistors, resistors, capacitors, diodes, fuses, etc. Accordingly, FIGS. 2-9 have been simplified for the sake of clarity to better understand the inventive concepts of the present disclosure. Additional features can be added in the multilayer device 200 and 300, and some of the features described below can be replaced or eliminated in other embodiments of the multilayer device 200 and 300.

Figure 2:
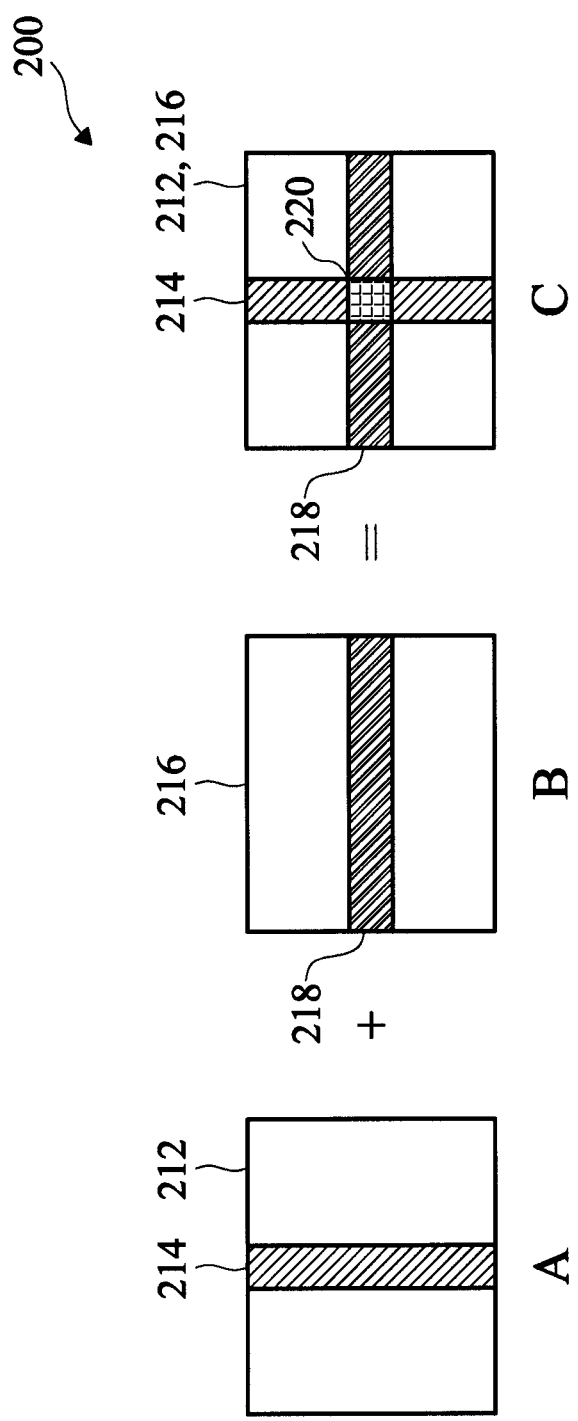
FIG. 2 is a diagrammatic fragmentary top view of a semiconductor device at various stages of fabrication in accordance with various aspects of the present disclosure.

Referring to FIG. 2, a top view of a multilayer device 200 is provided to better understand the concepts described herein. With regard to FIG. 2A, a first interlayer dielectric (ILD1) layer 212 is provided including a first metal (M1) layer 214. With regard to FIG. 2B, a second interlayer dielectric (ILD2) layer 216 is provided including a second metal (M2) layer 218. With respect to FIG. 2C, when the ILD2 layer 216 and M2 layer 218 of FIG. 2B is formed over the ILD1 layer 212 and M1 layer 214 of FIG. 2A, a self-aligned interconnect 220 results at the interface between the M1 and M2 layers 214, 218. As such, the M1 and M2 layers 214, 218 do not need to be aligned with a via as the self-aligned interconnect 220 will result at any point where lines of the M1 and M2 layers interface with each other.

Figure 3:
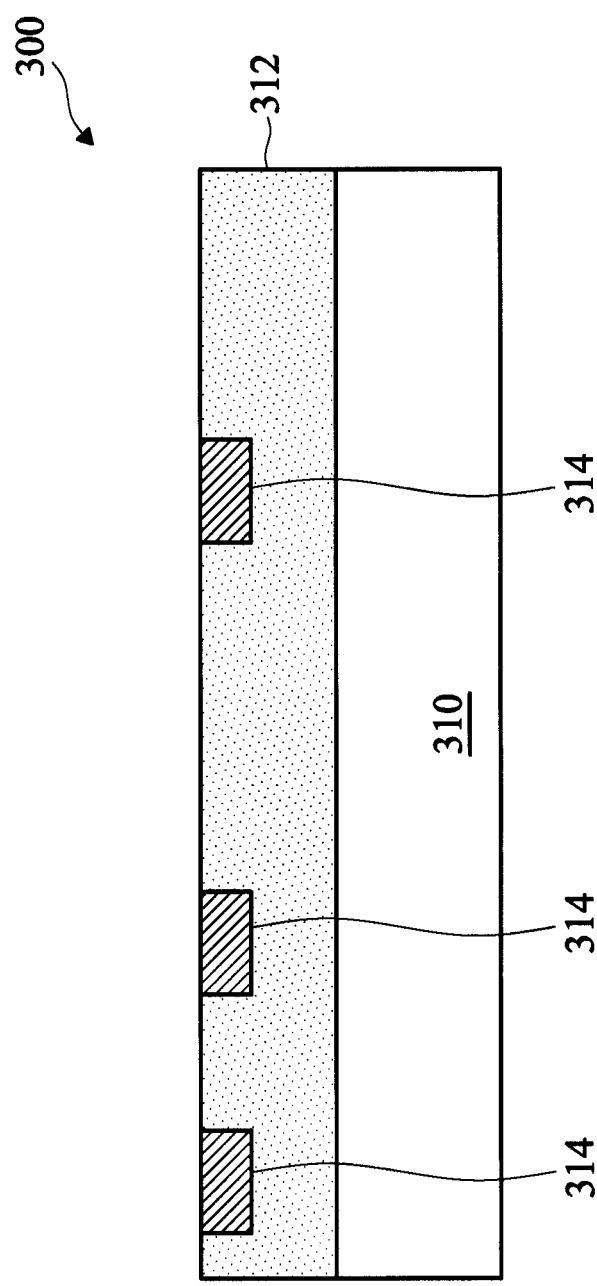
FIGS. 3-9 illustrate diagrammatic cross-sectional side views of one embodiment of a multilayer device at various stages of fabrication, according to the method of FIG. 1.

Referring to FIG. 3, a diagrammatic cross-sectional side view of a multilayer device is illustrated. The multilayer device 300 includes a substrate 310. The substrate 310 (e.g., wafer) is a bulk silicon substrate. Alternatively, the substrate 310 comprises an elementary semiconductor, such as silicon or germanium in a crystalline structure; a compound semiconductor, such as silicon germanium, silicon carbide, gallium arsenide, gallium phosphide, indium phosphide, indium arsenide, and/or indium antimonide; or combinations thereof. Alternatively, the substrate 310 includes a silicon-on-insulator (SOI) substrate. The SOI substrate can be fabricated using separation by implantation of oxygen (SIMOX), wafer bonding, and/or other suitable methods. The substrate 310 may include various devices and various features according to the various devices. For example, where the substrate 310 includes a field effect transistor device, various doped regions may be present to define source/drain regions. Likewise, where the substrate 310 includes any other device various features may be present to provide functionality or connection to the device.

Still referring to FIG. 3, the substrate 310 further includes a first interlayer dielectric (ILD1) layer 312. Formed within the ILD1 layer 312 is a first metal (M1) layer 314. The M1 layer 314 includes a plurality of lines used to provide connection between the various devices of the substrate 310 and other layers/devices of the multilayer device 300. The ILD1 layer 312 may include silicon nitride, silicon oxide, silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD1 layer 312 may be formed by any suitable processing including chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Still referring to FIG. 3, the M1 layer 314 may be formed by patterning a photoresist/hard mask and etching the ILD1 layer 312 to define the location of the M1 layer 314 within the ILD1 layer 312. After which, a conductive material, in the present embodiment a metal, is deposited within the etched portion to thereby form the M1 layer 314. The conductive material may include aluminum, copper, aluminum alloy, copper alloy, aluminum/silicon/copper alloy, titanium, titanium nitride, tantalum, tantalum nitride, tungsten, polysilicon, metal silicide, combinations thereof, or any suitable conductive material.

Figure 4:
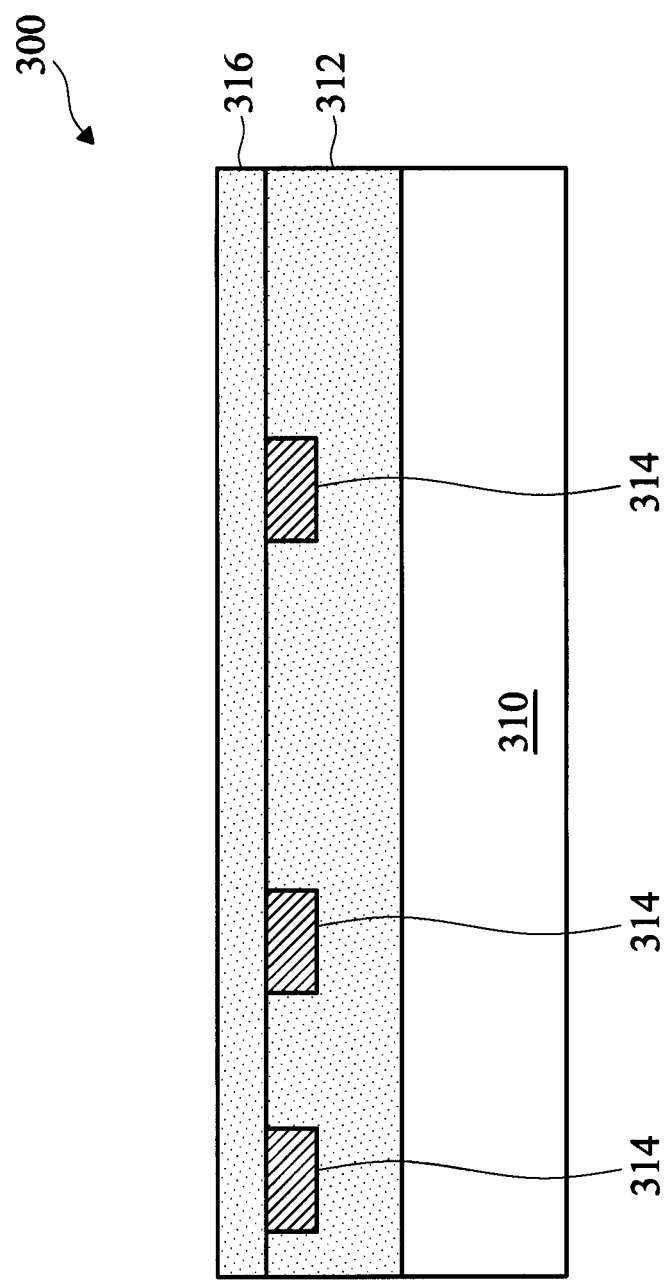

Referring to FIG. 4, formed over the ILD1 layer 312 is a second interlayer dielectric (ILD2) layer 316. The ILD2 layer 316 may include silicon oxide, silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD2 layer 316 may be formed by chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Figure 5:
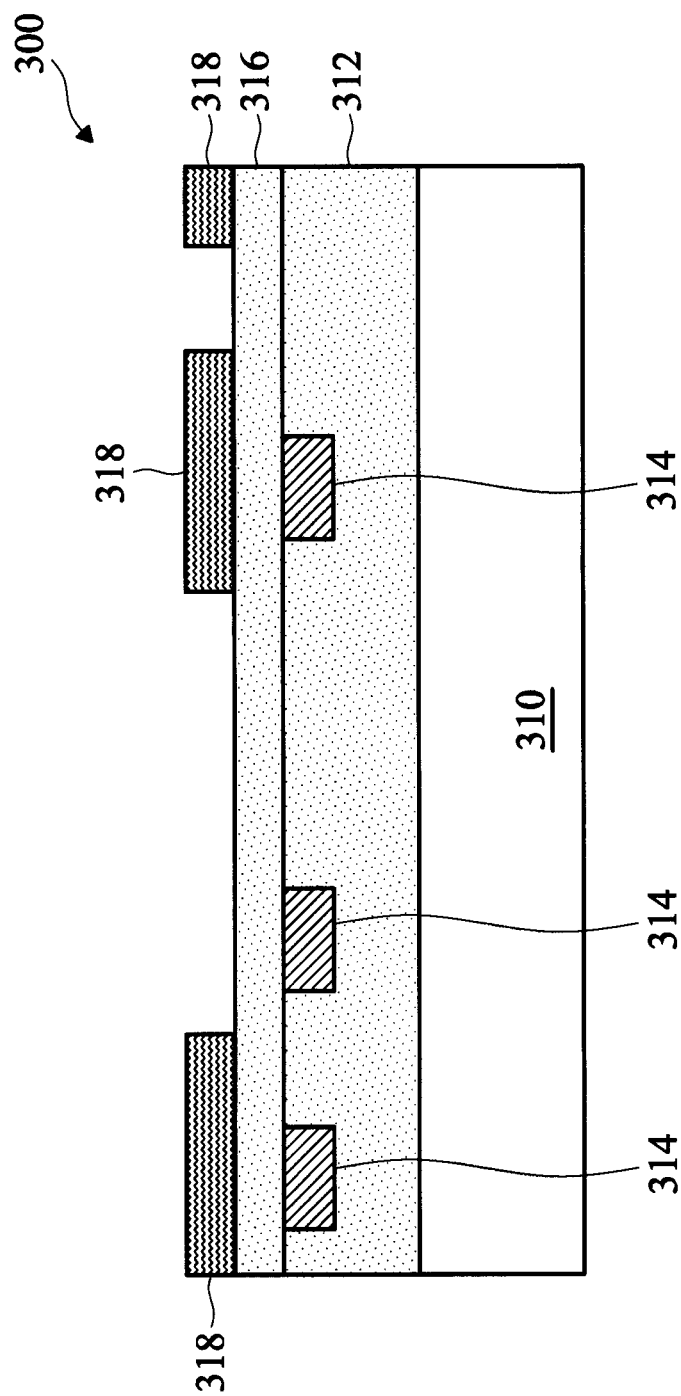

Referring to FIG. 5, a photoresist layer 318 is formed and patterned over the ILD2 layer 316 to define regions where the ILD2 layer 316 will be subsequently etched. Patterning the photoresist layer 318 includes exposing the photoresist layer 318 to a pattern, performing a post-exposure bake process, and developing the photoresist layer thereby forming a patterned photoresist layer 318. The patterning may also be implemented or replaced by other proper methods, such as maskless photolithography, electron-beam writing, ion-beam writing, and molecular imprint.

Figure 6:
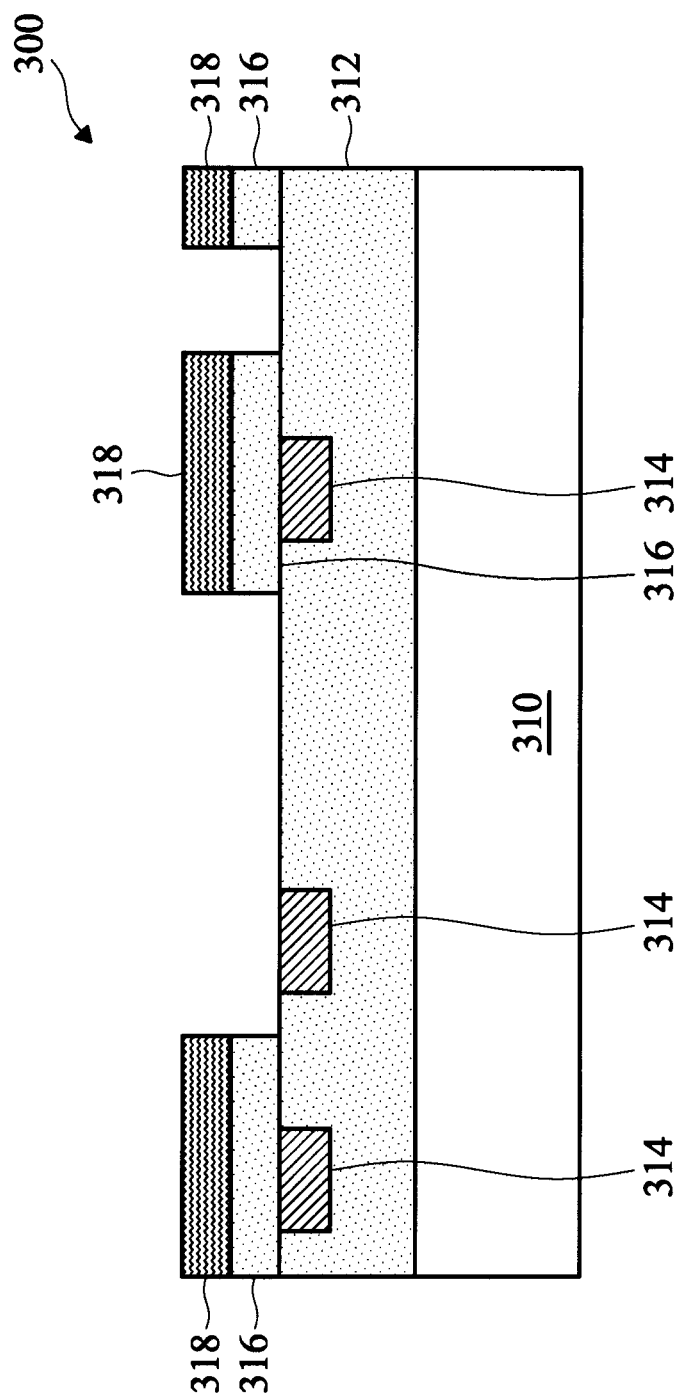

Referring to FIG. 6, the ILD2 layer 316 over the M1 layer 314 is etched, thereby uncovering a top surface of one or more lines of the M1 layer 314. The etching process uses the patterned photoresist layer 318 to define the area to be etched. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 316 that includes a chemistry including fluorine-containing gas. In furtherance of the example, the chemistry of the dry etch includes CF4, SF6, or NF3. As illustrated, in the present embodiment, the etching process is a time sensitive etching process that uses the etch rate of the etching chemistry to determine how long to etch such that the desired portions of the ILD2 layer 316 are etched while other portions of the ILD1 layer 312 remain. Alternatively, the etching process may be any suitable etching process and may stop according to design requirements.

Figure 7:
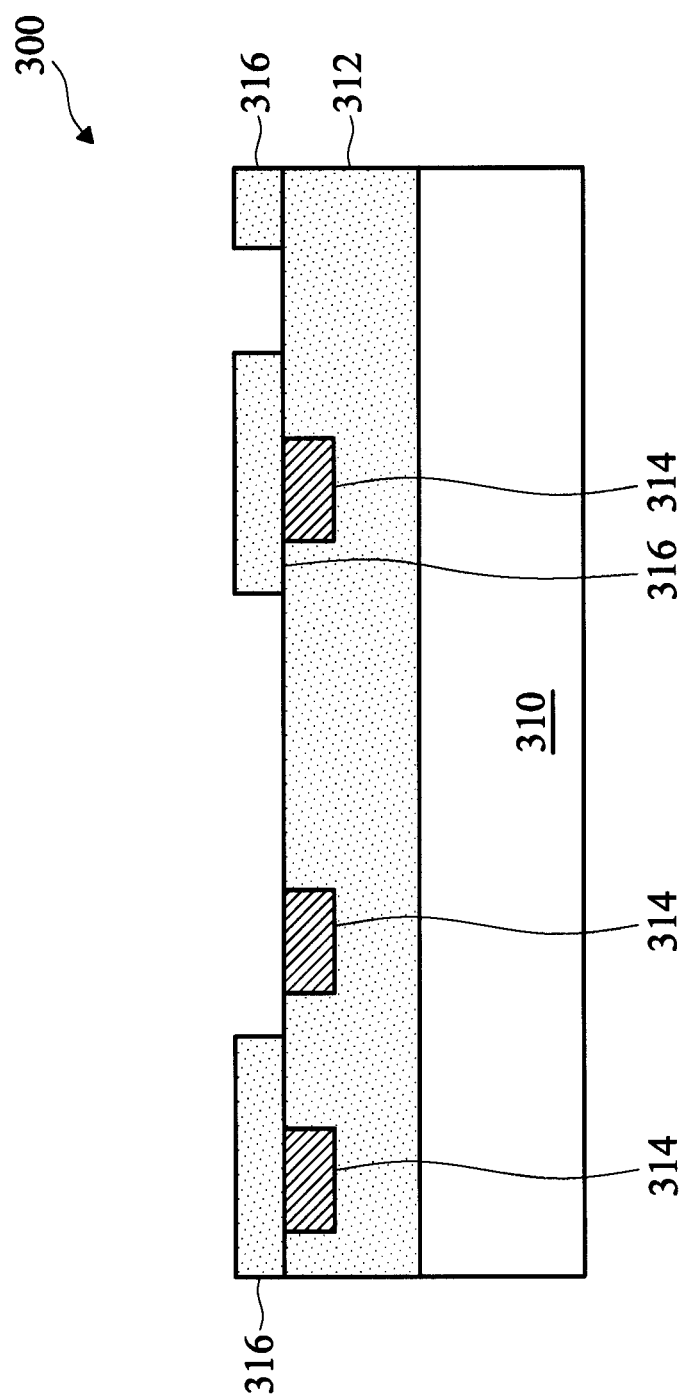

Referring to FIG. 7, after the etching process, the photoresist layer 318 may be removed by any suitable process. For example, the photoresist layer 318 may be removed by a liquid "resist stripper", which chemically alters the resist so that it no longer adheres to the underlying hard mask. Alternatively, photoresist layer 318 may be removed by a plasma containing oxygen, which oxidizes it.

Figure 8:
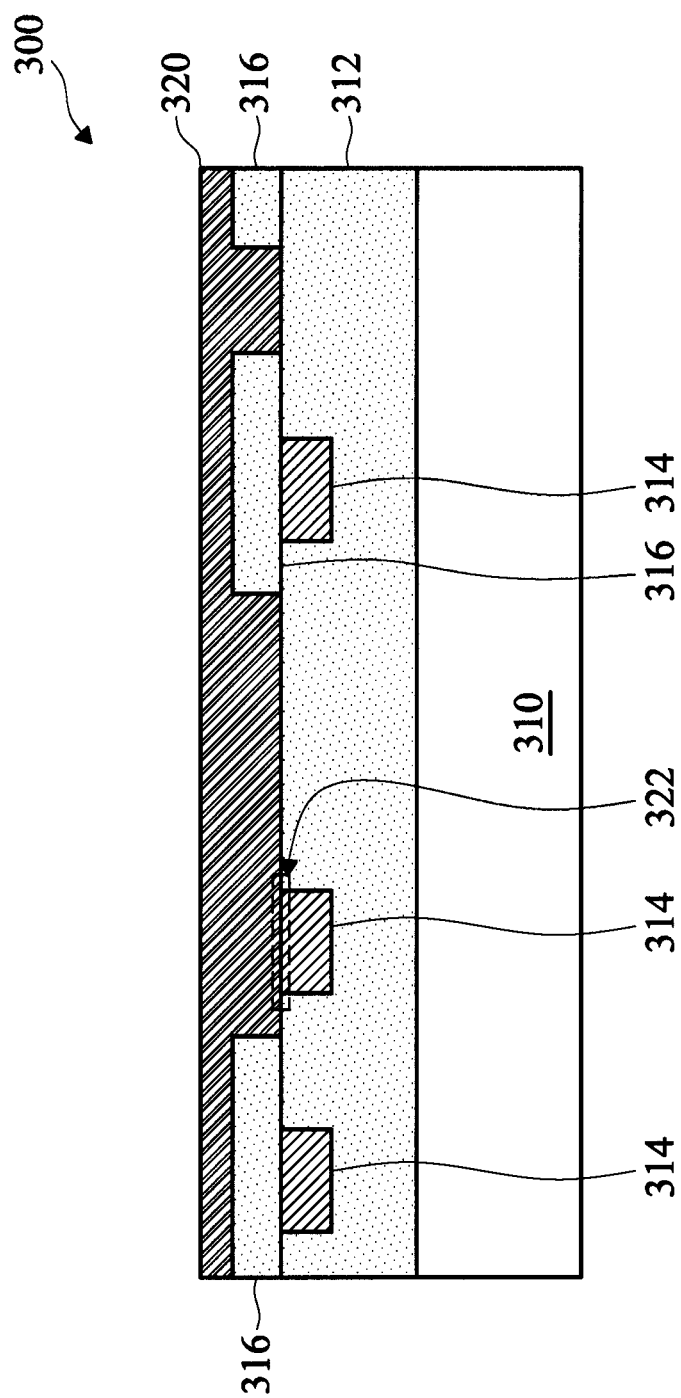

Referring to FIG. 8, a second metal (M2) layer 320 is formed for connecting to the M1 layer 314 and other devices/features of the multilayer device 300. The M2 layer 320 may include a metal such as aluminum, copper, aluminum alloy, copper alloy, aluminum/silicon/copper alloy, titanium, titanium nitride, tantalum, tantalum nitride, tungsten, polysilicon, metal silicide, combinations thereof, or any suitable conductive material. The M2 layer 320 may be formed by chemical vapor deposition (CVD), physical vapor deposition (PVD), atomic layer deposition (ALD), high density plasma CVD (HDPCVD), plating, other suitable methods, and/or combinations thereof. As illustrated, the M2 layer 320 is disposed over the M1 layer 314 and in electrical contact with the M1 layer 314. The interface between the lines of the M1 layer 314 and the M2 layer 320 forms a self-aligned interconnect 322. The interface is self-aligned because no via is required to be defined between the M1 layer 314 and the M2 layer 320. In the present embodiment, the M1 layer 314 and the M2 layer 320 are in direct and electrical contact. In alternative embodiments, a material is interposed between the two layer to provide electrical contact between the M1 layer 314 and the M2 layer 320.

Figure 9:
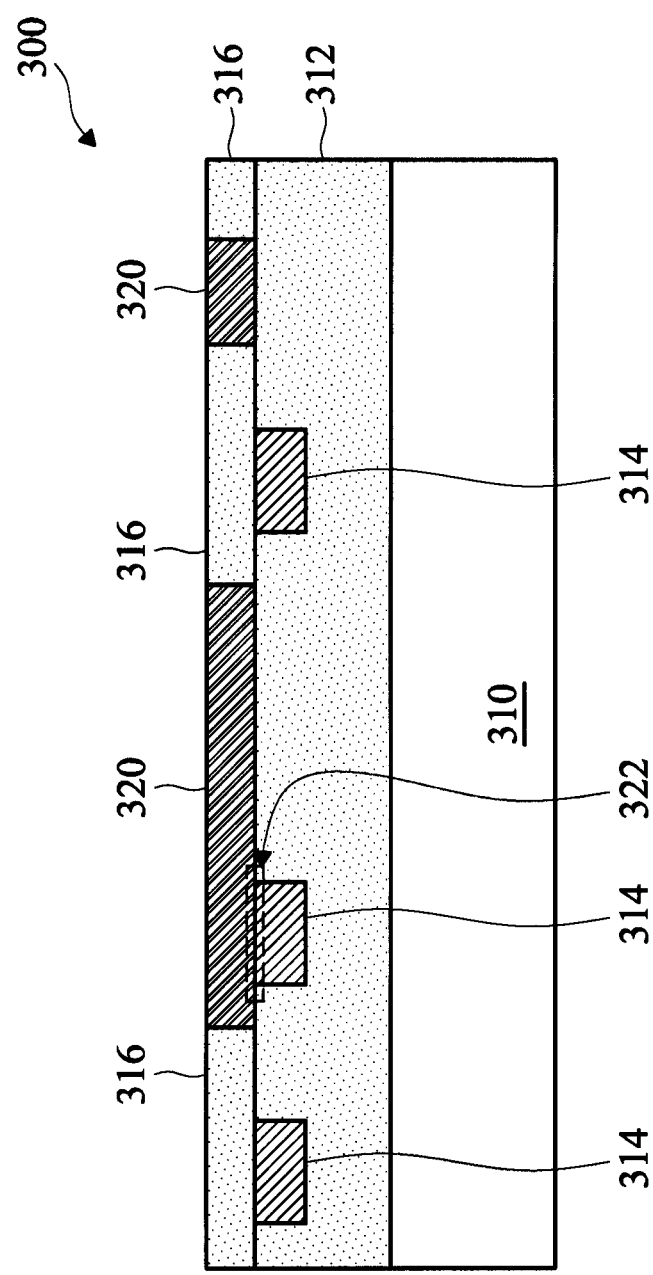

Referring to FIG. 9, the surface of the multilayer device 300 is planarized by a CMP process that removes excess material from the M2 layer 320. In embodiments, where the photoresist layer 318 has not been removed, the CMP process also removes the photoresist layer 318.

Figure 10:
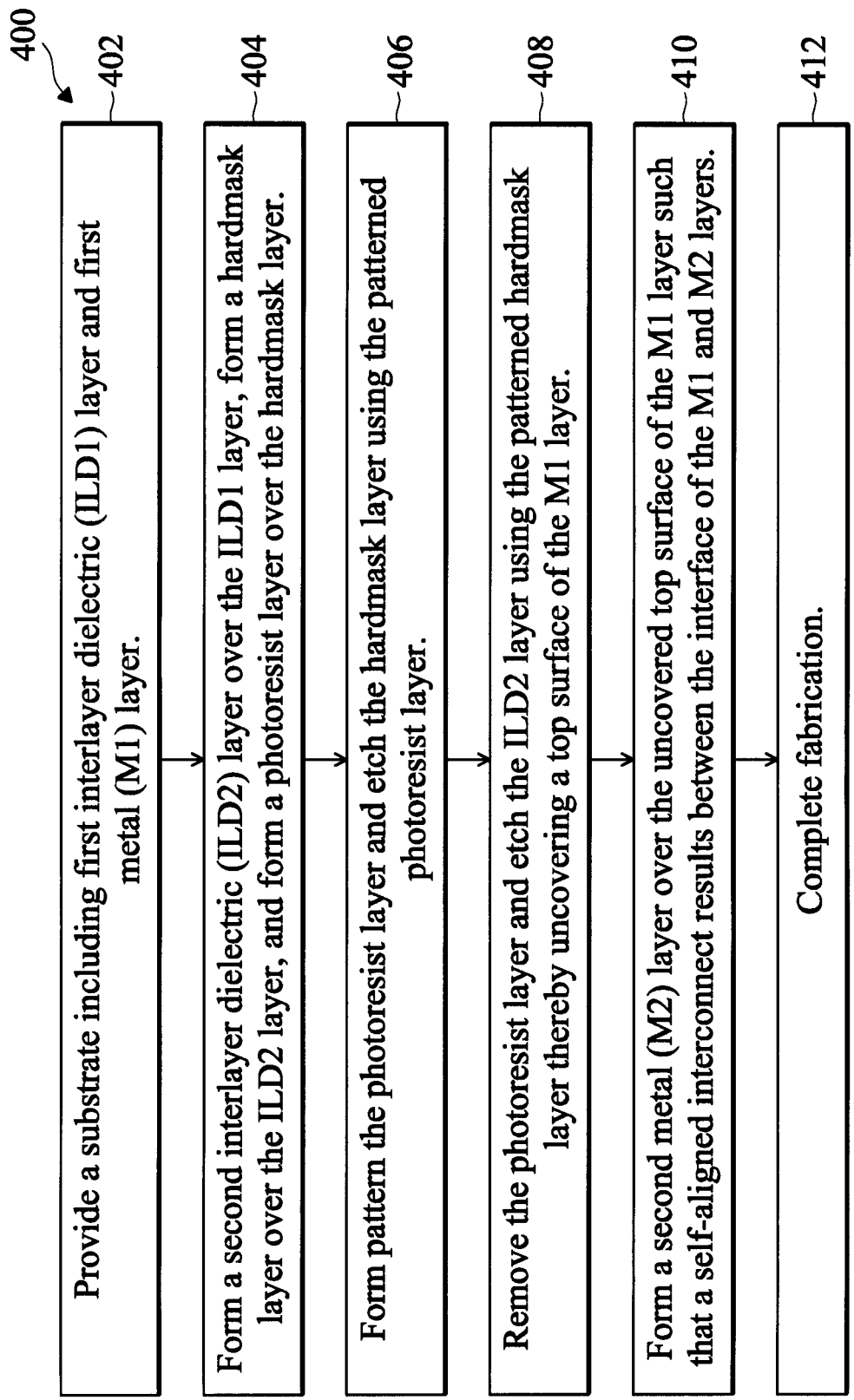
FIG. 10 is a flowchart illustrating a method of fabricating a multilayer device according to various aspects of the present disclosure.

Referring to FIG. 10, a method 400 for fabricating a semiconductor device is described according to various aspects of the present disclosure. The embodiment of method 400 may include similar process steps as an embodiment of the method 100 which is disclosed above. In disclosing the embodiment of method 400, some details regarding processing and/or structure may be skipped for simplicity if they are similar to those described in the embodiment of method 100.

In the present embodiment, the method 400 is for fabricating a multilayer integrated circuit device. The method 400 begins at block 402 where a substrate including first interlayer dielectric (ILD1) layer and first metal (M1) layer is provided. At block 404, second interlayer dielectric (ILD2) layer is formed over the ILD1 layer, a hard mask layer is formed over the ILD2 layer, and a photoresist layer is formed over the hard mask layer. The method continues with block 406 where the photoresist layer is patterned and the hard mask layer is etched using the patterned photoresist layer. The etching process may include multiple etching steps/process including dry etching, wet etching, or a combination of both. The method continues with block 408 where the photoresist layer is removed and the ILD2 layer is etched using the patterned hard mask layer, thereby uncovering a top surface of the M1 layer. At block 410, a second metal (M2) layer is formed over the uncovered top surface of the M1 layer such that a self-aligned interconnect results between the interface of the M1 and M2 layers. A CMP process may be performed to remove excess M2 layer material and the hard mask layer, thus planarizing the top surface of the multilayer device. In alternative embodiments, the patterned photoresist is removed after the formation of the M2 layer by the CMP process. The method 400 continues with block 412 where fabrication of the integrated circuit device is completed. It is understood that although the present embodiment describes the conductive layers as being metal layers (e.g., M1 and M2) the conductive layers may be any appropriate conductive material. Further, it is understood that although the present embodiment describes only two conductive layers (e.g., M1 and M2) more than two conducive layers are contemplated. Additional steps can be provided before, during, and after the method 400, and some of the steps described can be replaced or eliminated for other embodiments of the method. The discussion that follows illustrates various embodiments of a multilayer device that can be fabricated according to the method 400 of FIG. 10.

FIGS. 11-18 illustrate diagrammatic top and cross-sectional side views of one embodiment of a multilayer device 500 at various stages of fabrication, according to the method of FIG. 10. The semiconductor device 500 of FIGS. 11-18 is similar in certain respects to the semiconductor device 300 of FIGS. 3-9. Accordingly, similar features in FIGS. 3-9 and FIGS. 11-18 are identified by the same reference numerals for clarity and simplicity. It is understood that the multilayer device 500 may include various other devices and features, such as other types of transistors such as bipolar junction transistors, resistors, capacitors, diodes, fuses, etc., Accordingly, FIGS. 11-18 have been simplified for the sake of clarity to better understand the inventive concepts of the present disclosure. Additional features can be added in the multilayer device 500, and some of the features described below can be replaced or eliminated in other embodiments of the multilayer device 500.

Figure 11:
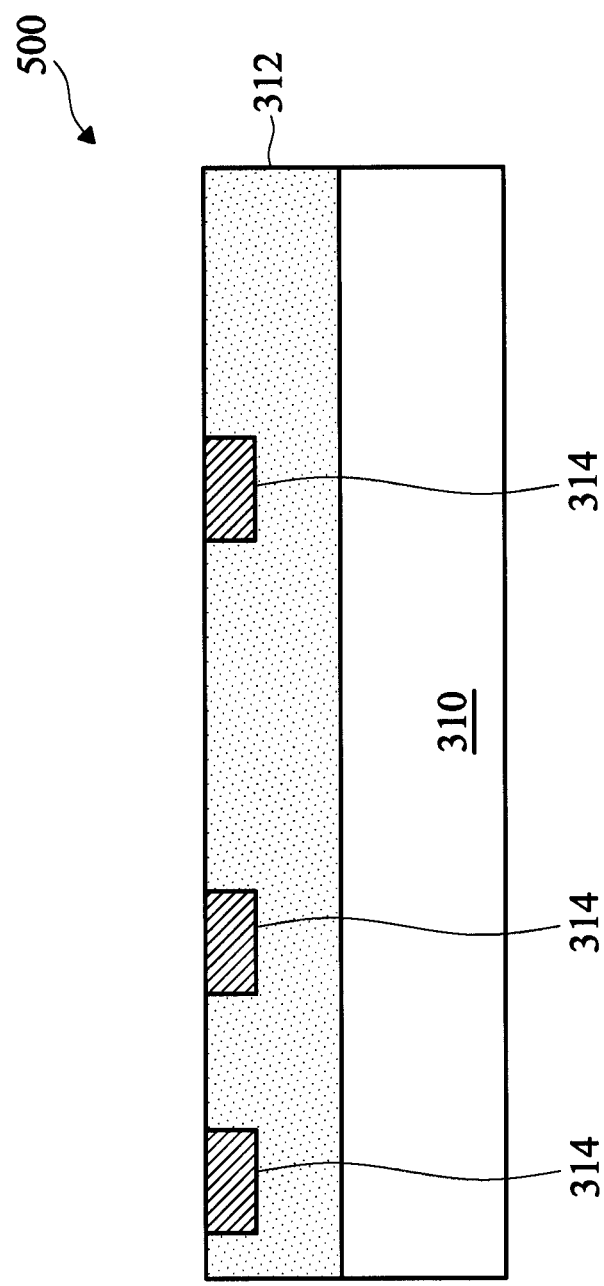

Referring to FIG. 11, a diagrammatic cross-sectional side view of multilayer device 500 is illustrated. The multilayer device 500 includes a substrate 310. In the present embodiment, the substrate 310 defined in the multilayer device 500 is substantially similar to the substrate 310 of the multilayer device 300 in terms of material composition and formation. In an alternative embodiment, they are different.

Still referring to FIG. 11, the substrate 310 further includes a first interlayer dielectric (ILD1) layer 312. In the present embodiment, the ILD1 layer 312 defined in the multilayer device 500 is substantially similar to the ILD1 layer 312 of the multilayer device 300 in terms of material composition and formation. In an alternative embodiment, they are different. Formed within the ILD1 layer 312 is a first metal (M1) layer 314. In the present embodiment, the M1 layer 314 defined in the multilayer device 500 is substantially similar to the M1 layer 314 of the multilayer device 300 in terms of material composition and formation. In an alternative embodiment, they are different.

Figure 12:
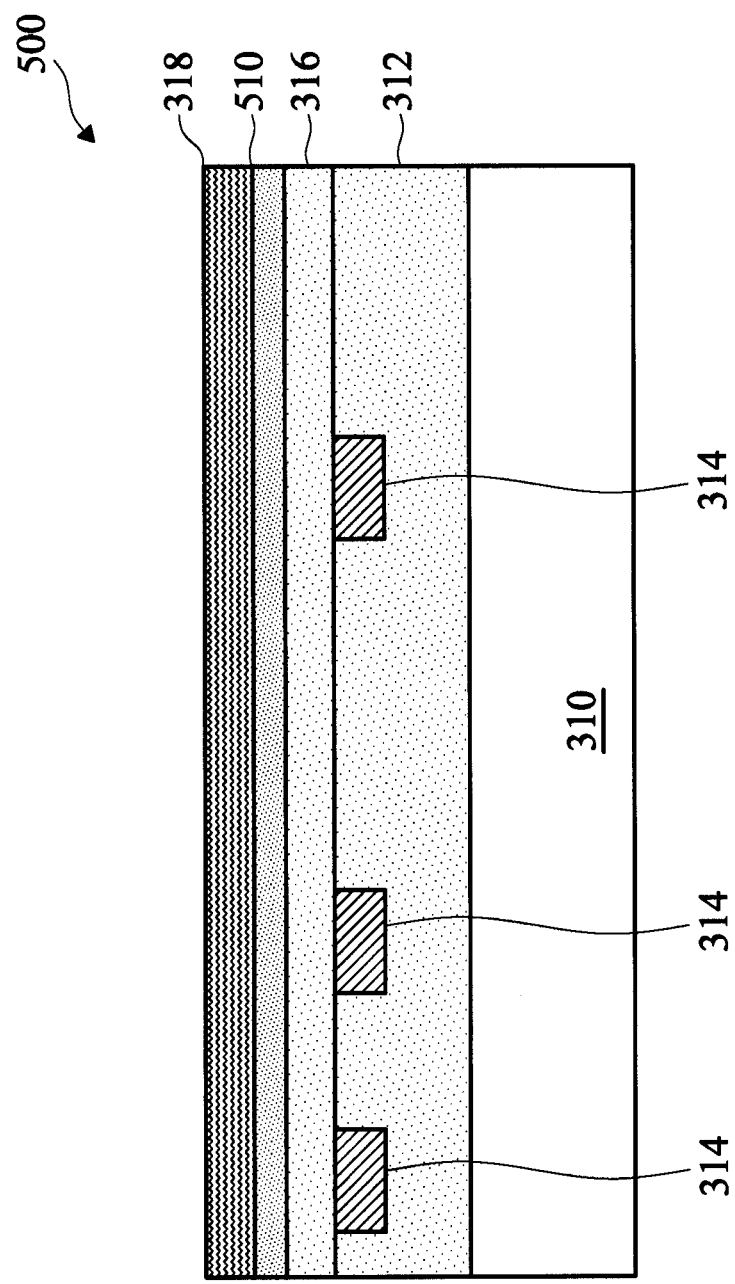

Referring to FIG. 12, formed over the ILD1 layer 312 is a second interlayer dielectric (ILD2) layer 316. In the present embodiment, the ILD2 layer 316 defined in the multilayer device 500 is substantially similar to the ILD2 layer 316 of the multilayer device 300 in terms of material composition and formation. In an alternative embodiment, they are different.

Still referring to FIG. 12, formed over the ILD2 layer 316 is a hard mask 510. Forming the hard mask 510 includes depositing a material over the ILD2 layer 316 using a CVD process. The material may include, for example, oxide, nitride, or other suitable material. In various examples, the hard mask 510 can be formed by atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6). Formed over the hard mask 510 is a photoresist layer 318. In the present embodiment, the photoresist layer 318 defined in the multilayer device 500 is substantially similar to the photoresist layer 318 of the multilayer device 300 in terms of material composition and formation. In an alternative embodiment, they are different.

Figure 13:
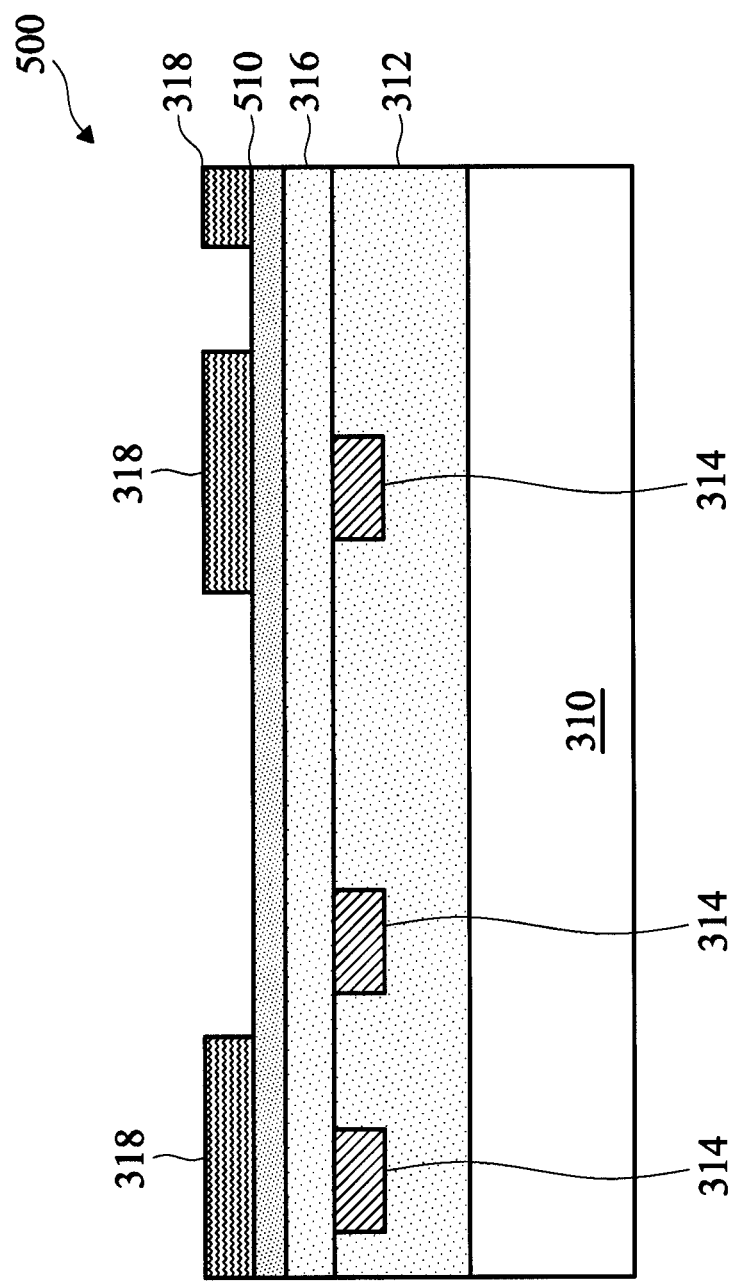

Referring to FIG. 13, the photoresist layer 318 is patterned to define regions where the hard mask 510 and the ILD2 layer 316 will be subsequently etched. Patterning the photoresist layer 318 includes exposing the photoresist layer 318 to a pattern, performing a post-exposure bake process, and developing the photoresist layer thereby forming a patterned photoresist layer 318. The patterning may also be implemented or replaced by other proper methods, such as maskless photolithography, electron-beam writing, ion-beam writing, and molecular imprint.

Figure 14:
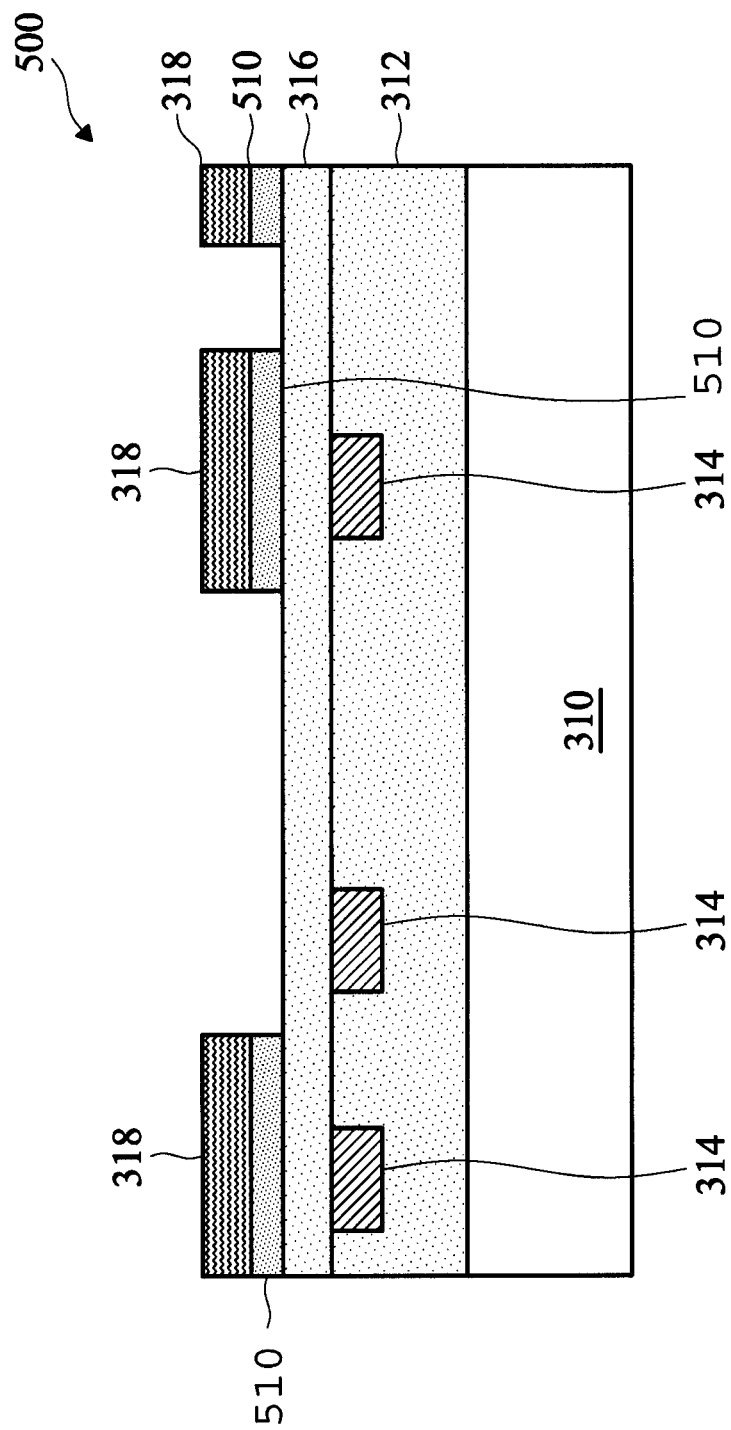

Referring to FIG. 14, the hard mask 510 is patterned using the patterned photoresist layer 318. Patterning the hard mask 510 includes an etching process. The etching process can include a wet etching process, a dry etching process, or a combination thereof. In one example, a dry etching process used to etch the hard mask may include a chemistry including fluorine-containing gas. In furtherance of the example, the chemistry of the dry etch includes CF4, SF6, or NF3.

Figure 15:
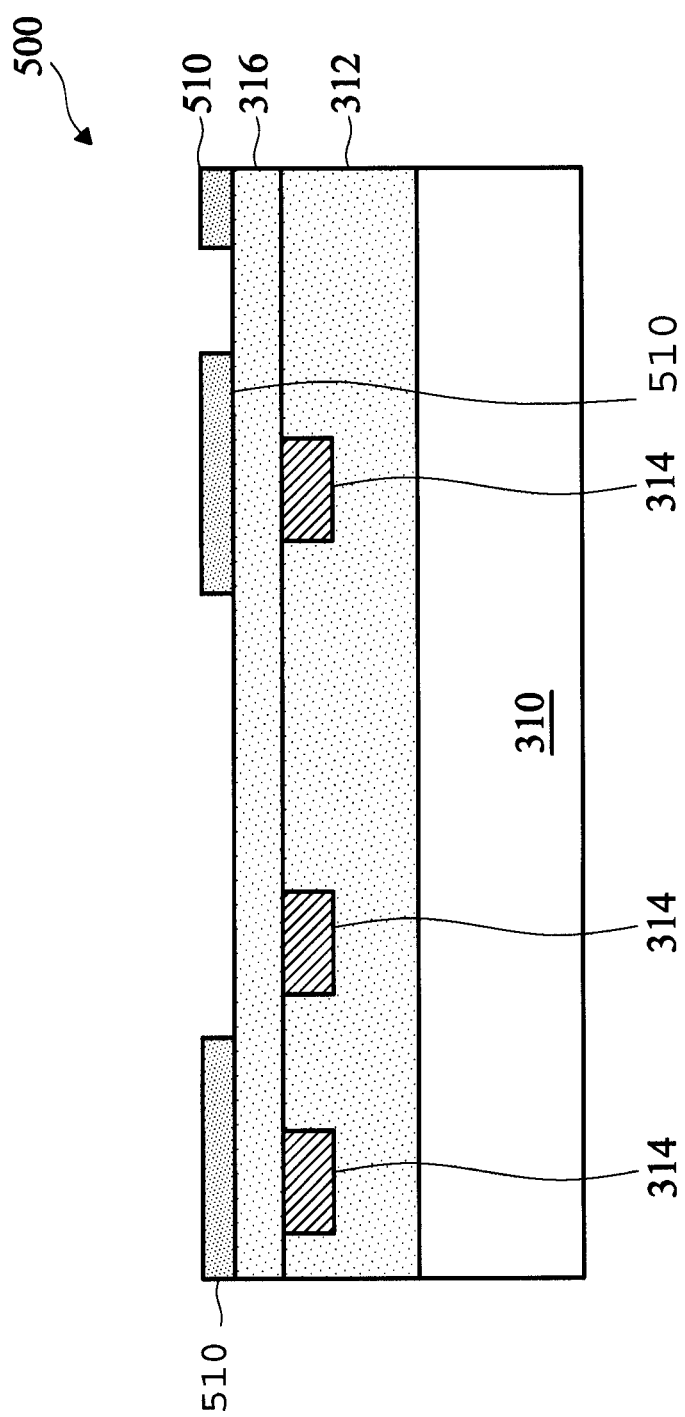

Referring to FIG. 15, after the hard mask 510 patterning process, the photoresist layer 318 may be removed by any suitable process. For example, the photoresist layer 318 may be removed by a liquid "resist stripper", which chemically alters the resist so that it no longer adheres to the underlying hard mask. Alternatively, photoresist layer 318 may be removed by a plasma containing oxygen, which oxidizes it.

Figure 16:
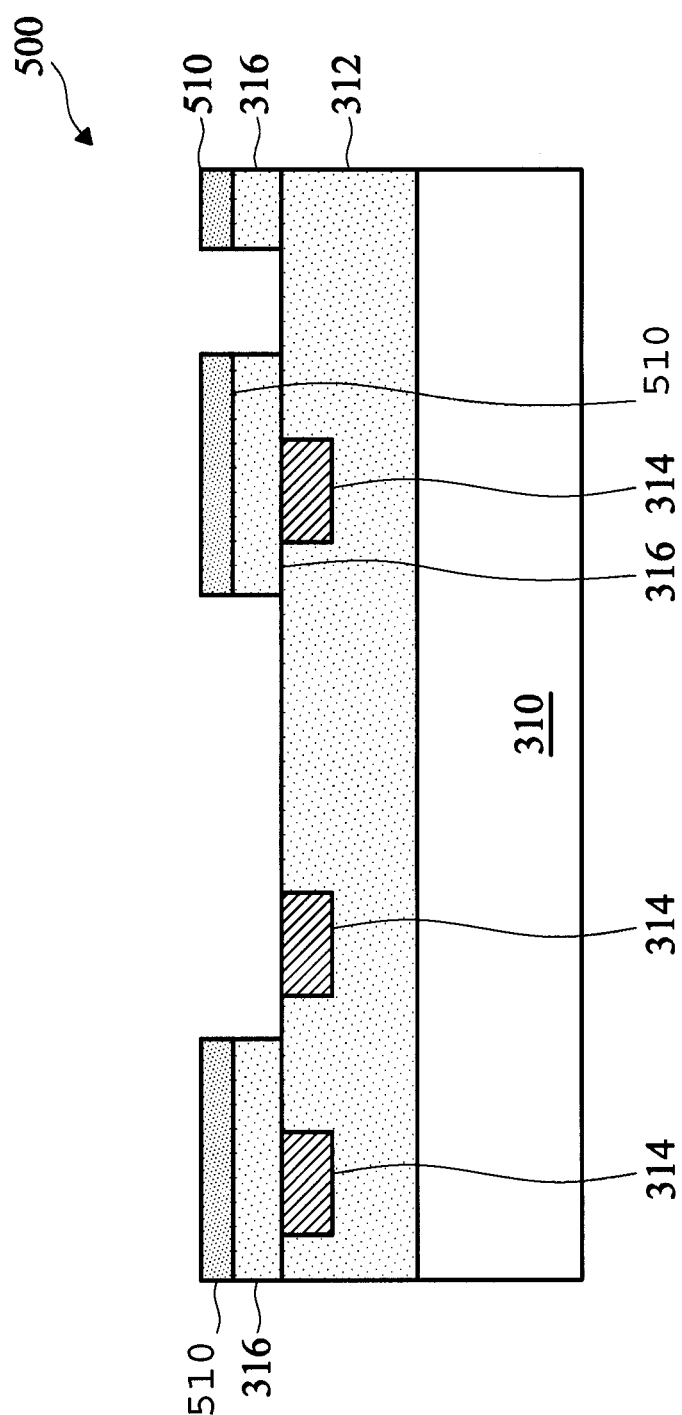

Referring to FIG. 16, the ILD2 layer 316 over the M1 layer 314 is etched, thereby uncovering a top surface of one or more lines of the M1 layer 314. The etching process uses the patterned hard mask 510 to define the area to be etched. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 316 that includes a chemistry including fluorine-containing gas. In furtherance of the example, the chemistry of the dry etch includes CF4, SF6, or NF3. As illustrated, in the present embodiment, the etching process is a time sensitive etching process that uses the etch rate of the etching chemistry to determine how long to etch such that the desired portions of the ILD2 layer 316 are etched while other portions of the ILD1 layer 312 remain. Alternatively, the etching process may be any suitable etching process and may stop according to design requirements.

Figure 17:
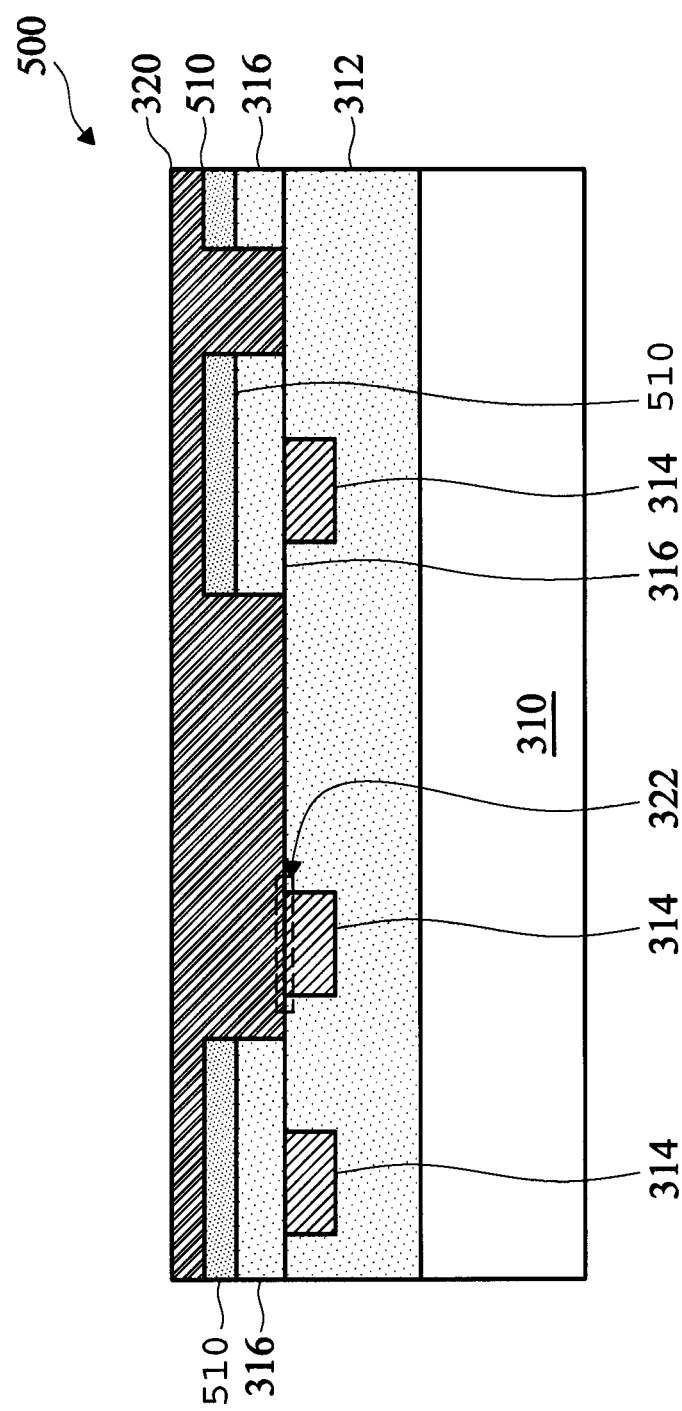

Referring to FIG. 17, a second metal (M2) layer 320 is formed for connecting to the M1 layer 314 and other devices/features of the multilayer device 500. In the present embodiment, the M2 layer 320 defined in the multilayer device 500 is substantially similar to the M2 layer 320 of the multilayer device 300 in terms of material composition and formation. In an alternative embodiment, they are different.

Referring to FIG. 18, the surface of the multilayer device 500 is planarized by a CMP process that removes excess material from the M2 layer 320 and also removes the hard mask 510. In embodiments, where the photoresist layer 318 has not been removed (as per FIG. 14), the CMP process also removes the photoresist layer 318.

As illustrated in FIGS. 9 and 18, the device 300 and 500 includes a substrate 310 having formed thereon a ILD1 layer 312 including M1 layer 314. The M1 layer includes a plurality of contact lines having a first direction. Formed over the ILD1 layer 312 is an ILD2 layer 316 including M2 layer 320. The M2 layer includes a plurality of contact lines having a second direction. The first direction and the second direction may be the same or different. Further, the first direction and the second direction may be parallel, orthogonal, or perpendicular. As illustrated at the interface where a line of the M2 layer 320 traverses a line of the M1 layer 314 a self-aligned interconnect is formed. Notably, in the illustrated embodiment, the line of the M2 layer 320 spans a width of the line of the M1 layer 314. It is understood that although the present embodiment only illustrates a single line of the M1 layer 314 being in contact with a line of the M2 layer 320 at an interface that forms a self-aligned interconnect, any number of such interfaces may be present in device 300, 500. As such, a singly line of the M2 layer 320 may have multiple interfaces with one or more lines of the M1 layer 314. Further, it is understood that the lines of the M1 layer 314 are in electrical contact with either the substrate 310 or with devices formed within the substrate 310. Furthermore, as illustrated the M2 layer 320 includes a thickness that is substantially the same as a thickness of the ILD2 layer 316. Additionally, in the illustrated embodiment, a top surface of the M2 layer 320 is coplanar with a top surface of the ILD2 layer 316 and a bottom surface of the M2 layer 320 is coplanar with a bottom surface of the ILD2 layer 316. It is understood that the M2 layer 320 may be formed through more than one ILD layers such that the M2 layer extends through both layers and forms a self-aligned interconnect with underlying layers. Further, it is understood that any number of conductive layers (M) and any number of ILD layers may be utilized, depending upon design requirements.

The above methods 100 and 400 provide for an improved process to form self-aligned interconnects between conductive layers of ILD layers, thereby improving the overlay control and reducing manufacturing cost when compared with traditional manufacturing processes. For example, because the self-aligned interconnects do not require vias to connect to lines of underlying conductive layers, multiple steps of aligning, patterning, and forming the vias are avoided. Further, the self-aligned interconnect that results at the interface of the lines of the conductive layers are robust and more reliable as compared to traditional methods that utilize vias. Further, the methods described herein can be easily implemented into current manufacturing process and technology, thereby lowering cost and minimizing complexity. Different embodiments may have different advantages, and no particular advantage is necessarily required of any embodiment.

It is understood that although the interconnect structure according to the present disclosure can be formed to be totally via-free, it need not necessarily be implemented that way. For example, in some alternative embodiments, some interconnect layers may be formed to be via-free by adopting the routing scheme of the present disclosure, while other interconnect layers may still utilize actual vias to interconnect their metal lines. The specific routing scheme of the interconnect structure may be configured and implemented according to design requirements and manufacturing concerns.

Thus, provided is a multilayer device. The exemplary multilayer device includes a substrate, a first interlayer dielectric (ILD) layer disposed on the substrate, and a first conductive layer including a first plurality of conductive lines formed in the first ILD layer. The device further includes a second ILD layer disposed on the first ILD layer, and a second conductive layer including a second plurality of conductive lines formed in the second ILD layer. At least one conductive line of the second plurality of conductive lines is formed adjacent to at least one conductive line of the first plurality of conductive lines. The at least one conductive line of the second plurality of conductive lines contacts the at least one conductive line of the first plurality of conductive lines at an interface. And, the interface provides electrical contact between the at least one conductive line of the second plurality of conductive lines and the at least one conductive line of the first plurality of conductive lines without the use of a via.

In some embodiments, the at least one conductive line of the second plurality of conductive lines includes a thickness that is substantially the same as a thickness of the second ILD layer. In various embodiments, the at least one conductive line of the second plurality of conductive lines extends through the second ILD layer. In certain embodiments, the first ILD layer includes a material selected from the group consisting of silicon nitride, silicon oxide, and silicon oxynitride. In further embodiments, the second ILD layer includes a material selected from the group consisting of silicon nitride, silicon oxide, and silicon oxynitride. In some embodiments, the first and second plurality of conductive lines include a material selected from the group consisting of aluminum (Al), tungsten (W), and copper (Cu). In various embodiments, the first ILD layer and the second ILD layer are low-k dielectric layers. In certain embodiments, the interface spans a width of the at least one conductive line of the first plurality of conductive lines.

Also provided is an alternative embodiment of a multilayer device. The multilayer device includes a substrate, a first interlayer dielectric (ILD) layer disposed on the substrate, and a first conductive layer disposed within the first ILD layer, the first conductive layer including a first plurality of conductive lines having an orientation in a first direction. The multilayer device further includes a second ILD layer disposed over the first ILD layer and over the first plurality of conductive lines, and a second conductive layer disposed within the second ILD layer and over the first ILD layer and over the first plurality of conductive lines, the second conductive layer including a second plurality of conductive lines having an orientation in a second direction. A conductive line of the second plurality of conductive line traverses a conductive line of the first plurality of conductive lines at an interface. A surface of the conductive line of the first plurality of conductive lines is in electrical contact with a surface of the conductive line of the second plurality of conductive lines at the interface, and the interface is a self-aligned interconnect.

In some embodiments, the first direction and the second direction are substantially the same. In various embodiments, the first direction and the second direction are different. In certain embodiments, the first direction and the second direction are orthogonal. In further embodiments, the first direction and the second direction are perpendicular. In some embodiments, the second conductive layer includes a thickness substantially the same as a thickness of the second ILD layer. In further embodiments, the second conductive layer includes a top surface that is substantially coplanar with a top surface of the second ILD layer, and the second conductive layer includes a bottom surface that is substantially coplanar with a bottom surface of the second ILD layer.

Also provided is a method of forming a multilayer device. The exemplary method includes providing a substrate, forming a first interlayer dielectric (ILD) layer over the substrate, and forming a first conductive layer within the first ILD layer. The method further includes forming a second ILD layer over the first ILD layer and over the first conductive layer, and forming a patterned mask layer over the second ILD layer, the pattern of the mask layer including an opening over a first line of the first conductive layer. The method further includes etching a trench through the second ILD layer within the opening of the mask layer, thereby uncovering a top surface of the first line of the first conductive layer and a top surface of the first ILD layer adjacent to the first line of the first conductive layer. The method further includes forming a first line of a second conductive layer within the etched trench, the first line of the second conductive layer extending over the uncovered top surface of the first line of the first conductive layer and extending over the uncovered top surface of the first ILD layer adjacent to the first line of the first conductive layer. A self-aligned interconnect results where the first line of the second conductive layer extends over the uncovered top surface of the first line of the first conductive layer.

In some embodiments, the mask layer is a photoresist layer. In various embodiments, forming the mask layer includes: forming a hard mask layer over the second ILD layer; forming a photoresist layer over the hard mask layer; patterning the photoresist layer and the hard mask layer thereby defining the opening over the first line of the first conductive layer; and before etching the trench through the second ILD layer, removing the photoresist layer. In further embodiments, the method includes performing a planarizing process such that excess material of the second conductive layer and the hard mask layer are removed. In some embodiments, the opening of the mask layer is greater than a width of the first line of the first conductive layer. In various embodiments, the first and second conductive layers include a material selected from the group consisting of aluminum (Al), tungsten (W), and copper (Cu). In certain embodiments, the second conductive layer includes a thickness substantially the same as a thickness of the second ILD layer. In some embodiments, the first ILD layer and the second ILD layer are low-k dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multilayer device comprising:
    a substrate;
    a first interlayer dielectric (ILD) layer disposed over the substrate, the first ILD layer in direct contact with the substrate;
    a first conductive layer including a first plurality of parallel conductive lines each having a first thickness, disposed within the first ILD layer, and extending a partial thickness through the first ILD layer, the first plurality of conductive lines comprising a first conductive line, a second line, and a third conductive line positioned between the first conductive line and the second conductive line, there being no conductive features between the first conductive line and the second conductive line except the third conductive line,
    wherein the first plurality of conductive lines has an orientation in a first direction,
    wherein at least a portion of the first ILD layer is between the first conductive layer and the substrate;
    a second ILD layer having a second thickness disposed over the first ILD layer; and
    a second conductive layer including a second plurality of conductive lines each having a third thickness, disposed within the second ILD layer,
    wherein the first, second, and third thicknesses are substantially equal,
    wherein the first plurality of conductive lines are formed of a first metal and the second plurality of conductive lines are formed of a second metal that is different than the first metal,
    wherein at least one conductive line of the second plurality of conductive lines has an orientation in a second direction and is formed adjacent to and in direct contact with the third conductive line, the at least one conductive line of the second plurality of conductive lines having a first end positioned between the first conductive line and the third conductive line and a second end positioned between the third conductive line and the second conductive line, wherein the second direction is orthogonal to the first direction,
    wherein the at least one conductive line of the second plurality of conductive lines contacts the third conductive line of the first plurality of conductive lines at an interface, and
    wherein the interface provides electrical contact between the at least one conductive line of the second plurality of conductive lines and the third conductive line of the first plurality of conductive lines without the use of a via,
    wherein the interface spans a width of the third conductive line of the first plurality of conductive lines, the width extending from a first sidewall of the third conductive line of the first plurality of conductive lines to a second sidewall of the third conductive line of the first plurality of conductive lines.

2. The multilayer device of claim 1 wherein the at least one conductive line of the second plurality of conductive lines extends through the second ILD layer.

3. The multilayer device of claim 1 wherein the first ILD layer includes a material selected from the group consisting of silicon nitride, silicon oxide, and silicon oxynitride.

4. The multilayer device of claim 3 wherein the second ILD layer includes a material selected from the group consisting of silicon nitride, silicon oxide, and silicon oxynitride.

5. The multilayer device of claim 1 wherein the first and second plurality of conductive lines include a material selected from the group consisting of aluminum (Al), tungsten (W), and copper (Cu).

6. The multilayer device of claim 1 wherein the first ILD layer and the second ILD layer are low-k dielectric layers.

7. A device comprising:
    a substrate;
    a first interlayer dielectric (ILD) layer disposed over the substrate, the first ILD layer in direct contact with the substrate;
    a first conductive layer having a first thickness, disposed within the first ILD layer, the first conductive layer including a first plurality of conductive lines having the first thickness and an orientation in a first direction, and extending a partial thickness through the first ILD layer, the first plurality of conductive lines comprising a first conductive line, a second line, and a third conductive line positioned between the first conductive line and the second conductive line, there being no conductive features between the first conductive line and the second conductive line except the third conductive line,
    wherein part of the first ILD layer is between the first conductive layer and the substrate;
    a second ILD layer having a second thickness, disposed over the first ILD layer and over the first plurality of conductive lines; and
    a second conductive layer having a third thickness, disposed within the second ILD layer and over the first ILD layer and over the first plurality of conductive lines, the second conductive layer including at least one conductive line of a second plurality of conductive lines having the third thickness and an orientation in a second direction, the at least one conductive line of the second plurality of conductive lines having a first end positioned between the first conductive line and the third conductive line and a second end positioned between the third conductive line and the second conductive line,
    wherein the first, second, and third thicknesses are substantially equal,
    wherein the first plurality of conductive lines are formed of a metal and the second plurality of conductive lines are formed of polysilicon,
    wherein the second direction is perpendicular to the first direction,
    wherein the at least one conductive line of the second plurality of conductive line traverses the third conductive line of the first plurality of conductive lines at an interface spanning a width of the conductive line of the first plurality of conductive lines, the width extending from a first sidewall of the third conductive line of the first plurality of conductive lines to a second sidewall of the third conductive line of the first plurality of conductive lines, wherein a surface of the third conductive line of the first plurality of conductive lines is in electrical contact with a surface of the at least one conductive line of the second plurality of conductive lines at the interface, and wherein the interface is a self-aligned interconnect.

8. The device of claim 7 wherein the second conductive layer includes a top surface that is substantially coplanar with a top surface of the second ILD layer, and wherein the second conductive layer includes a bottom surface that is substantially coplanar with a bottom surface of the second ILD layer.

9. A multilayer device comprising:

a substrate;

a first conductive layer having a first thickness, including a first plurality of conductive lines having the first thickness, surrounded by a first interlayer dielectric (ILD) layer, and extending a partial thickness through the first ILD layer, the first plurality of conductive lines comprising a first conductive line, a second line, and a third conductive line positioned between the first conductive line and the second conductive line, there being no conductive features between the first conductive line and the second conductive line except the third conductive line, wherein the first ILD layer is directly coupled to the substrate, wherein the first plurality of conductive lines are not in direct contact with the substrate;

a second ILD layer having a second thickness, disposed over the first ILD layer; and a second conductive layer having a third thickness, including a second plurality of conductive lines having the third thickness, disposed within the second ILD layer, wherein the first, second, and third thicknesses are substantially equal, wherein the first plurality of conductive lines are formed of a first metal and the second plurality of conductive lines are formed of a second metal that is different than the first metal, wherein at least one conductive line of the second plurality of conductive lines is formed adjacent to and in direct contact with the third conductive line, the at least one conductive line of the second plurality of conductive lines having a first end positioned between the first conductive line and the third conductive line and a second end positioned between the third conductive line and the second conductive line, wherein the at least one conductive line of the second plurality of conductive lines extends through the second ILD layer, and wherein an interface provides electrical contact between the at least one conductive line of the second plurality of conductive lines and the third conductive line of the first plurality of conductive lines without the use of a via, wherein at the interface the third conductive line of the first plurality of conductive lines is oriented orthogonally to the at least one conductive line of the second plurality of conductive lines, wherein the interface spans a width of the third conductive line of the first plurality of conductive lines, the width extending from a first sidewall of the third conductive line of the first plurality of conductive lines to a second sidewall of the third conductive line of the first plurality of conductive lines.

10. The multilayer device of claim 9 wherein the at least one conductive line of the second plurality of conductive lines extends through the second ILD layer.

11. The multilayer device of claim 9 wherein the first ILD layer includes a material selected from the group consisting of silicon nitride, silicon oxide, and silicon oxynitride.

12. The multilayer device of claim 11 wherein the second ILD layer includes a material selected from the group consisting of silicon nitride, silicon oxide, and silicon oxynitride.

13. The multilayer device of claim 9 wherein the first and second plurality of conductive lines include a material selected from the group consisting of aluminum (Al), tungsten (W), and copper (Cu).

14. The multilayer device of claim 9 wherein the first ILD layer and the second ILD layer are low-k dielectric layers.

15. The device of claim 7, wherein the first ILD layer includes a material selected from the group consisting of silicon nitride, silicon oxide, and silicon oxynitride.

16. The device of claim 7, wherein the first ILD layer includes a low-k material.

17. The device of claim 7, wherein the second ILD layer includes a material selected from the group consisting of silicon nitride, silicon oxide, and silicon oxynitride.

18. The device of claim 7, wherein the second ILD layer includes a low-k material.

* * * * *